United States Patent
Liu et al.

(10) Patent No.: US 6,503,832 B2
(45) Date of Patent: Jan. 7, 2003

(54) APPLICATION OF CONTROLLING GAS VALVES TO REDUCE PARTICLES FROM CVD PROCESS

(75) Inventors: Hung Wei Liu, Taichung (TW); Chi Tung Huang, Hsinchu (TW); Chung Yeh Lee, Hisnchu (TW); Chien Chia Lin, ShinHua Jen (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/781,429

(22) Filed: Feb. 13, 2001

(65) Prior Publication Data

US 2002/0111020 A1 Aug. 15, 2002

(51) Int. Cl.$^7$ ............................................... H01L 21/44
(52) U.S. Cl. ........................................ 438/680; 438/905
(58) Field of Search ................................ 438/680, 905, 438/908, 935

(56) References Cited

U.S. PATENT DOCUMENTS

| | | | | |
|---|---|---|---|---|
| 6,048,804 A | * | 4/2000 | Smith et al. | 438/790 |
| 6,090,725 A | * | 7/2000 | Yang et al. | 438/784 |
| 6,191,035 B1 | * | 2/2001 | Cheng et al. | 438/680 |
| 6,210,745 B1 | * | 4/2001 | Gaugham et al. | 427/8 |
| 6,267,820 B1 | * | 7/2001 | Chen et al. | 118/726 |

* cited by examiner

Primary Examiner—David Nelms
Assistant Examiner—David Nhu
(74) Attorney, Agent, or Firm—Rosenberg, Klein & Lee

(57) ABSTRACT

The present invention proposes an application of controlling gas valves to reduce particles from the CVD process. First, the actions of opening and closing a gas valve are added to let particles possibly adhering on the gas valve fall during the idle period between the CVD processes of a wafer and the next wafer. Next, an inert gas is led in to purge the gas valve and the reaction chamber. Finally, a gas-extracting means is used to extract the gas out. The actions of opening and closing the gas valve only take a few seconds so that the time of the next wafer entering the reaction chamber to perform the CVD process will not be influenced. The present invention has the advantage of increasing the yield of wafer while the production is not influenced and the original fabrication equipments need not be changed.

2 Claims, 2 Drawing Sheets

APPLICATION OF CONTROLLING GAS VALVES TO REDUCE PARTICLES FROM CVD PROCESS

FIELD OF THE INVENTION

The present invention relates to a fabrication process of performing the chemical vapor deposition (CVD) on silicon wafers and, more particularly, to an application of controlling gas valves to reduce particles from the CVD process.

BACKGROUND OF THE INVENTION

It is an important process for semiconductors using the CVD process to form an insulating layer or a thin film layer of silicon dioxide on the surface of a wafer placed in water vapor or oxygen. This process is performed in a reaction chamber connected with transport pipes. The transport pipe is designed to have a plurality of gas valves. The amount of gas flowing into the reaction chamber is controlled by opening or closing the gas valves. In the CVD process, because oxygen easily reacts with highly active gases, particles will form and thus precipitate in a valve. If the particles flow into the reaction chamber along with the gases, the insulating layer or the thin film layer will not grow uniformly on the wafer when performing the CVD process. Defects on the wafer will let the integrated circuits formed on the wafer be problematic. Therefore, the use value of the wafer will be reduced, resulting in waste of production.

The prior art method of resolving the problem of particles is described below. First, the gas valves are opened to let an inert gas flow through the transport pipe and the gas valves and then into the reaction chamber during the idle period of the reaction chamber. Next, the gas valves are closed and a pump is used to extract the gas and the particles out so as to purge the gas valves and the reaction chamber. Although the count of undesirable wafers can be effectively reduced by the actions of opening and closing the gas valves described above during the idle period of the reaction chamber, the possibility of a wafer generating particles in the CVD process to fall onto the next wafer cannot be reduced. Therefore, the yield of wafer will be deteriorated. The present invention aims to propose a method of clearing particles so that the above problems in the prior art can be resolved.

SUMMARY OF THE INVENTION

The primary object of the present invention is to provide an application of controlling gas valves to reduce particles from the CVD process so that the yield of wafer can be increased under the premise that the production is not influenced.

According to the present invention, the application of controlling gas valves to reduce particles from the CVD process is described below. First, the actions of opening and closing a gas valve are added to let the particles possibly adhering on the valve fall during the idle period between the CVD processes of a wafer and the next wafer. Next, an inert gas is led in to purge the gas valve and the reaction chamber. Finally, a pump is used to extract the gas out. Thereby, the possibility of particles entering the reaction chamber during the CVD process of the next wafer can be prevented.

The various objects and advantages of the present invention will be more readily understood from the following detailed description when read in conjunction with the appended drawings, in which:

DETAILED DESCRIPTION OF THE PREFERRED EMBODIMENTS

Figure 1:
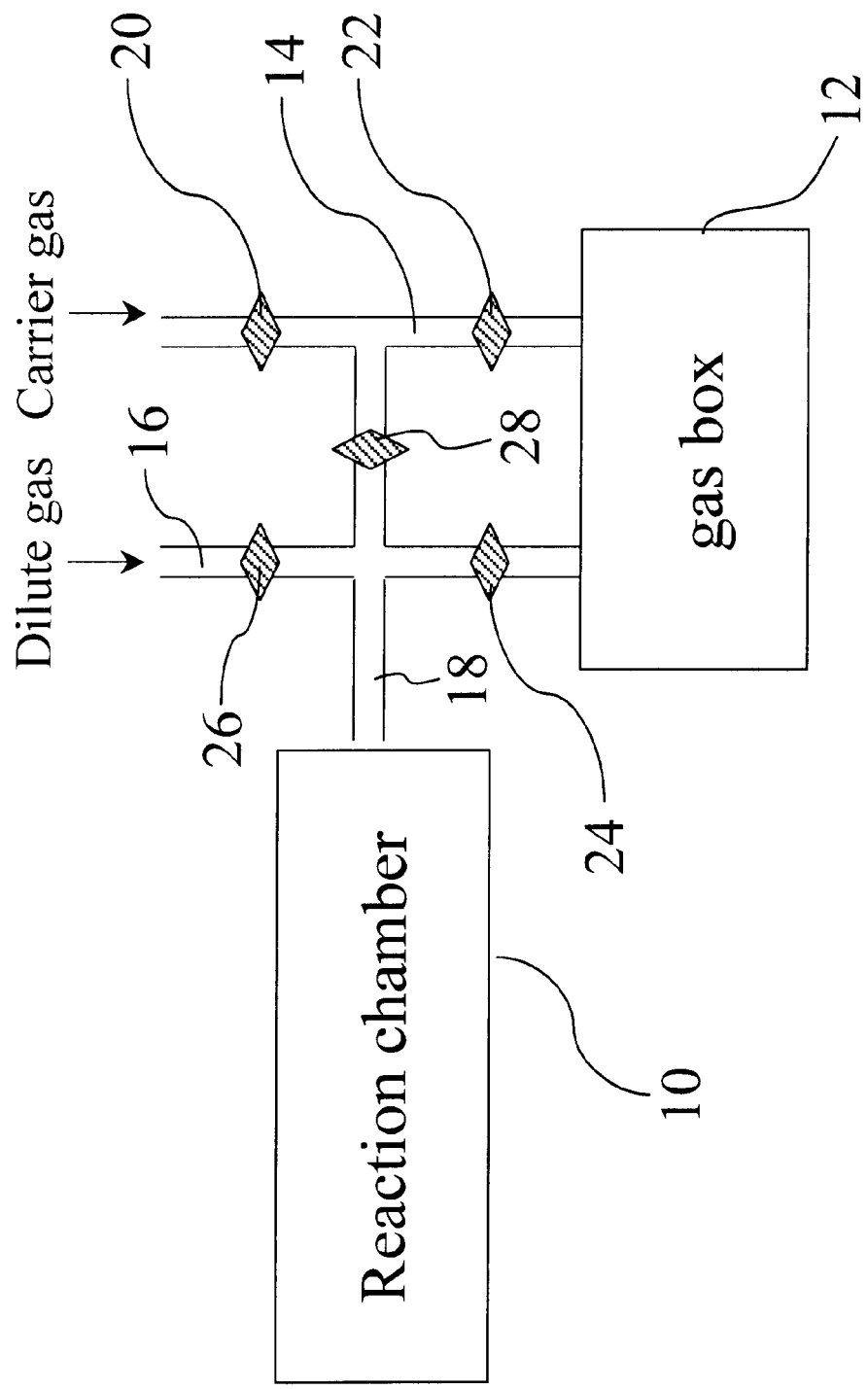
FIG. 1 is a diagram of the equipment for performing the CVD process on wafers according to an embodiment of the present invention.

The present invention provides an application of controlling gas valves to reduce particles from the CVD process. The CVD process equipment of a preferred embodiment is described below to illustrate the present invention. As shown in FIG. 1, the CVD process is performed in a reaction chamber 10. Reaction gases required in the process are stored in a gas box 12, which is connected to a first transport pipe 14 for transporting a carrier gas and to a second transport pipe 16 for transporting a dilute gas. A third transport pipe 18 is used to connect the first transport pipe 14 and the second transport pipe 16 so that gases can flow between the three transport pipes 14, 16, and 18. One end of the third transport pipe 18 is connected to the reaction chamber 10. The carrier gas is an inert gas. A first gas valve 20 and a second gas valve 22 are provided on the first transport pipe 14 at opposite sides of the third transport pipe 18. A third gas valve 24 and a fourth gas valve 26 are provided on the second transport pipe 16 at opposite sides of the third transport pipe 18. A fifth transport pipe 28 is provided on the third transport pipe 18 between the first transport pipe 14 and the second transport pipe 16.

The dilute gas will flow via the second transport pipe 16 into the gas box 12 so as to dilute the reaction gas therein when the fifth gas valve 28 is closed and the other four gas valves 20, 22, 24, and 26 are opened. The carrier gas will flow in the first transport pipe 14 to pass the first gas valve 20 and the second gas valve 22 and then flow into the gas box 12 so as to carry the reaction gas therein to flow in the third transport pipe 18 and to pass the third gas valve 24 and finally into the reaction chamber 10, thereby achieving the object of carrying the reaction gas into the reaction chamber 10 for the CVD process to be performed on a wafer. After the CVD process, the fifth gas valve is quickly opened and closed to let particles possibly adhering thereon fall. Subsequently, the fifth gas valve 28 is opened, and the second, the third, and the fourth gas valves 22, 24, and 26 are closed. The inert gas used as the carrier gas will thus pass the first gas valve 20 and the third gas valve 28 and then flow into the reaction chamber 10. Thereby, the whole CVD equipment can be purged while the gas box 12 is not influenced.

Figure 2A:
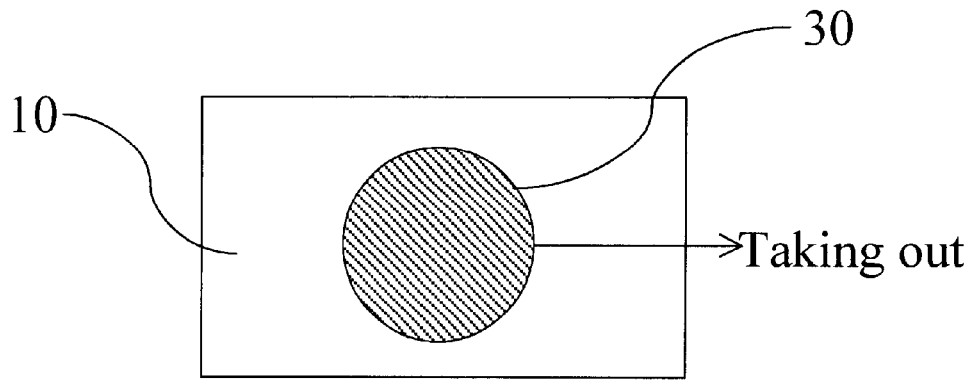
FIGS. 2a to 2c are diagrams showing the successive actions of the present invention.
Figure 2B:
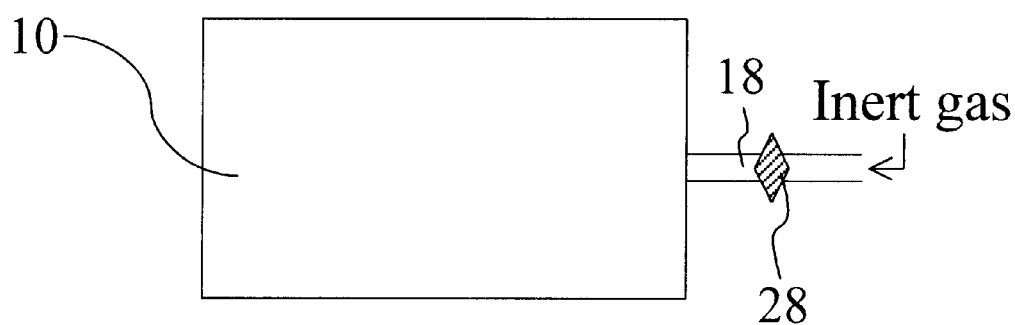
Figure 2C:
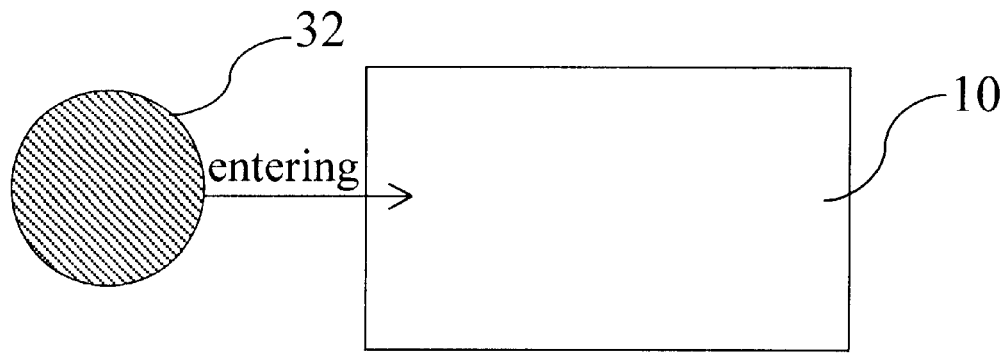

As shown in FIG. 1, in the fabrication method of the present invention, a first wafer 30 enters the reaction chamber 10. Meanwhile, as shown in FIG. 2a, the first gas valve 20, the second gas valve 22, the third gas valve 24, and the fourth gas valve 26 are opened, while the fifth gas valve 28 is closed to let the carrier gas and the dilute gas flow to lead the reaction gas in the gas box 12 to flow into the reaction chamber 10 so that the CVD process of the first wafer 30 can be performed. The first wafer 30 is then taken out thereafter. To avoid the situation that oxygen reacts with active gases to form particles and thus precipitate in the fifth gas valve 28 where no gas flows through so that the particles may enter the reaction chamber 10 to decrease the yield of subsequent process, when the first wafer 30 is taken out of the reaction chamber 10, the fifth gas valve 28 is first opened and closed to let particles possibly adhering in the fifth gas valve 28 fall, as shown in FIG. 2b. Next, the first gas valve 20 and the fifth gas valve 28 are opened, and the second gas valve 22, the third gas valve 24, and the fourth gas valve 26 are closed to let the inert gas used as the carrier gas pass the first gas valve 20 and the fifth gas valve 28 and then flow into the reaction chamber 10. Subsequently, the first and the fifth gas valves are closed, and a gas-extracting means (not shown) is used to extract the inert gas along with the remained reaction gas and particles out, thereby purging the fifth gas valve 28 and the reaction chamber 10. The gas-extracting means can be a pump. A second wafer 32 then enters the reaction chamber, as shown in FIG. 2c, and the above controlling procedures of opening and closing the gas valves are repeated to perform the CVD process to the second wafer 32.

During the first wafer 30 is taken out of the reaction chamber 10 and the second wafer 32 still does not enter the reaction chamber 10, the actions of opening and closing the fifth gas valve are first added to let particles possibly adhering thereon fall. The inert gas is then led in to purge the fifth gas valve and the reaction chamber. Thereby, the situation that an insulating layer or a thin film layer will not grow uniformly on the next wafer so as to influence subsequent IC fabrication procedures because of particles when the CVD process is performed to the next wafer can be prevented. Moreover, the actions of opening and closing the fifth gas valve only take a few seconds so that the time of the next wafer entering the reaction chamber to perform the CVD process will not be influenced. Therefore, the production of the whole process will not be influenced. Furthermore, the present invention only adds the actions of opening and closing the gas valves so that new equipments are not required. That is, the present invention has the advantage of increasing the yield of wafer under the premise that the production is not influenced and the original fabrication equipments need not be changed.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A method of removing residual particles from a chemical vapor deposition system having a reaction chamber, a reaction gas source, and carrier and dilute transport conduits disposed in selective communication therewith, said method comprising the steps of:

(a) establishing an interconnecting transport conduit extending between the carrier and dilute transport conduits;

(b) establishing a gas valve for selectively opening and closing said interconnecting transport conduit;

(c) introducing at least one first wafer into the reaction chamber and processing therein by actuating the chemical vapor deposition system;

(d) maintaining said gas valve closed during said processing of said first wafer;

(e) removing said first wafer from the reaction chamber following said processing;

(f) momentarily opening and thereafter closing said gas valve prior to purging for causing the release of residual particles from surface adhesion;

(g) purging the system subsequent to said step (f) by again opening said gas valve for the introduction of the residual particles into the reaction chamber; and, (h) extracting the residual particles from said reaction chamber.

2. The method of removing residual particles from a chemical vapor deposition system as recited in claim 1 wherein the step of extracting the residual particles from the reaction chamber includes pumping gaseous material therefrom.

\* \* \* \* \*